(12) United States Patent
Sakamoto et al.

(10) Patent No.: US 8,987,148 B2
(45) Date of Patent: Mar. 24, 2015

(54) SEMICONDUCTOR DEVICE MANUFACTURING METHOD

(75) Inventors: Misato Sakamoto, Kanagawa (JP);
Yoshitake Katou, Kanagawa (JP);
Youichi Yamamoto, Kanagawa (JP);
Takashi Kyouno, Kanagawa (JP);
Chikara Yamamoto, Yamagata (JP);
Terukazu Motosawa, Yamagata (JP);
Mitsuo Maeda, Yamagata (JP); Hiroshi Itou, Yamagata (JP)

(73) Assignee: Renesas Electronics Corporation, Kawasaki-shi (JP)

( * ) Notice: Subject to any disclaimer, the term of this patent is extended or adjusted under 35 U.S.C. 154(b) by 260 days.

(21) Appl. No.: 13/414,062

(22) Filed: Mar. 7, 2012

(65) Prior Publication Data
US 2012/0238043 A1  Sep. 20, 2012

(30) Foreign Application Priority Data

Mar. 14, 2011  (JP) .................. 2011-055284

(51) Int. Cl.
| H01L 21/324 | (2006.01) |
| H01L 21/477 | (2006.01) |
| H01L 21/42 | (2006.01) |
| H01L 21/26 | (2006.01) |
| H01L 21/67 | (2006.01) |
| H01L 21/687 | (2006.01) |

(52) U.S. Cl.
CPC ...... *H01L 21/67253* (2013.01); *H01L 21/6875* (2013.01); *H01L 21/67109* (2013.01); *Y10S 438/974* (2013.01)
USPC .......... 438/795; 438/674; 438/680; 438/785; 438/799; 438/974; 257/E21.529; 257/E21.295

(58) Field of Classification Search
None
See application file for complete search history.

(56) References Cited

U.S. PATENT DOCUMENTS

| 6,080,444 | A | 6/2000 | Shimizu et al. | |
| 7,582,544 | B2 * | 9/2009 | Gunji et al. | 438/478 |
| 7,915,179 | B2 * | 3/2011 | Sato et al. | 438/775 |
| 8,354,337 | B2 * | 1/2013 | Matsumoto et al. | 438/608 |
| 2010/0323512 | A1 * | 12/2010 | Matsumoto et al. | 438/608 |

FOREIGN PATENT DOCUMENTS

| JP | 10-189489 A | 7/1998 |
| JP | 2009-224422 A | 10/2009 |

OTHER PUBLICATIONS

Office Action dated Apr. 8, 2014, in Japanese Patent Application No. 2011-055284.

* cited by examiner

*Primary Examiner* — Bac Au
*Assistant Examiner* — Khanh Duong
(74) *Attorney, Agent, or Firm* — Miles & Stockbridge P.C.

(57) ABSTRACT

With a stage kept in an as-heated state, a semiconductor wafer is placed over the stage. Then, with the elapse of a first time, a controller causes a pressure inside a vacuum chamber to rise to a second pressure higher than a first pressure (step S40). After the semiconductor wafer is placed over the stage, a pressure difference between a pressure inside the vacuum chamber and a pressure inside an adsorption port is set to a minimum value at which the semiconductor wafer is not allowed to slide over protrusions. Further, in step S40 as well, the pressure difference is kept at the minimum value at which the semiconductor wafer is not allowed to slide over the protrusions.

10 Claims, 9 Drawing Sheets

SEMICONDUCTOR DEVICE MANUFACTURING METHOD

CROSS-REFERENCE TO RELATED APPLICATIONS

The disclosure of Japanese Patent Application No. 2011-55284 filed on Mar. 14, 2011 including the specification, drawings and abstract is incorporated herein by reference in its entirety.

BACKGROUND

The present invention relates to a semiconductor device manufacturing method.

In the manufacture of a semiconductor device, a wafer may be heated to a predetermined temperature at a time of processing under a low-pressure atmosphere, such as deposition processing. A semiconductor device manufacturing system for use in such processing as described incorporates a vacuum chamber provided with a stage having a heating unit. This stage is provided with an adsorption port, and protrusions for supporting the wafer.

In Patent Document 1, it is described that if a pressure inside a chamber is kept substantially constant at the time of deposition processing while a series of steps including chemical vapor deposition (CVD) are carried out after the chamber is brought into a reduced-pressure state, this would cause a decrease in stress occurring to a formed film.

Parent Document 1: Japanese Unexamined Patent Application Publication No. Hei10(1998)-189489

SUMMARY

The inventor has noticed that, in the case where processing of a wafer is carried out in a semiconductor device having a stage provided with an adsorption port, and protrusions, cracking of the wafer may occur. The inventor has conducted studies of this problem and has concluded that flaws attributable to the protrusions of the stage occur to a back surface of the wafer, and the wafer undergoes cracking owing to the flaws each acting as a starting point of the cracking. Accordingly, the inventor has conducted studies to ascertain how to prevent the flaws attributable to the stage from occurring to the back surface of the wafer while also inhibiting deterioration in productivity of a semiconductor device.

According to one aspect of the present invention, there is provided a method for manufacturing a semiconductor device by use of a semiconductor manufacturing system having a vacuum chamber, and a stage disposed inside the vacuum chamber, the stage being provided with protrusions formed on an upper surface thereof, an adsorption port for adsorbing a wafer thereto, and a heating unit, the manufacturing method comprising, an initial process for placing the wafer over the stage, the stage being kept in an as-heated state, and setting a pressure inside the vacuum chamber to a first pressure, subsequently holding the first pressure for the duration of first time, and a heating process for raising the pressure inside the vacuum chamber to a second pressure higher than the first pressure with the stage kept in the as-heated state after the initial process to thereby heat up the wafer.

According to another aspect of the present invention, the pressure inside the vacuum chamber is set to the first pressure after the wafer is placed over the stage kept in the as-heated state. Subsequently, in the heating process, the pressure inside the vacuum chamber is raised to the second pressure higher than the first pressure. With the lower first pressure, flaws attributable to the stage can be inhibited from occurring to the back surface of the wafer. Further, the pressure inside the vacuum chamber is rendered higher in the heating stage, thereby rendering it possible to heat up the wafer in short time. Accordingly, it is possible to inhibit deterioration in productivity of a semiconductor device.

According to the aforementioned aspects of the present invention, it is possible to inhibit the flaws attributable to the stage from occurring to the back surface of the wafer while inhibiting deterioration in productivity of a semiconductor device.

DETAILED DESCRIPTION

Figure 1A:
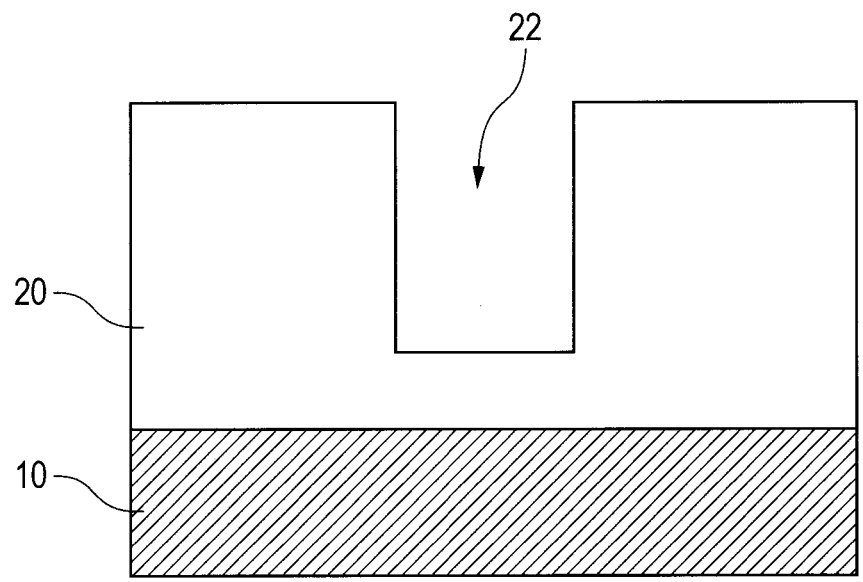
FIGS. 1A and 1B are sectional views showing a semiconductor device manufacturing method according to a first embodiment of the invention.

Embodiments of the invention are described hereinafter with reference to the accompanying drawings. In all the figures, identical constituents are denoted by like reference numerals, omitting therefore description thereof where appropriate.

First Embodiment

Figure 1B:
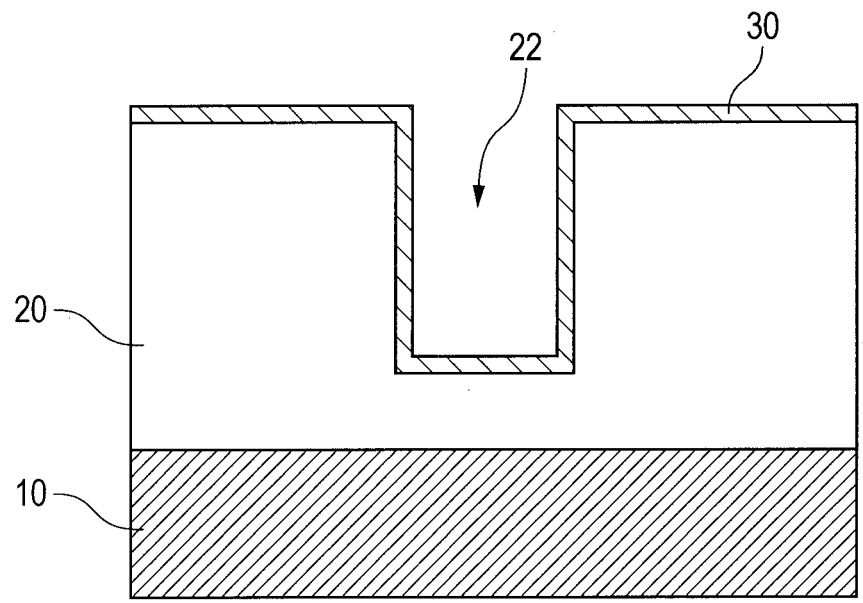

FIGS. 1A and 1B are sectional views showing a semiconductor device manufacturing method according to a first embodiment of the invention. The method shown in FIGS. 1A and 1B is a method for forming a conductor film 30 over an insulating film 20.

First, a semiconductor wafer 10 is guided into a vacuum chamber of a semiconductor manufacturing system to be subsequently placed on a stage. As shown in FIG. 1A, the insulating film 20 and a recess 22 are preformed over the semiconductor wafer 10. The insulating film 20 may have a stacked structure made up by depositing a plurality of insulating films one after another. Further, the bottom of the recess 22 may be positioned at an interface between the insulating films that are stacked up. The recess 22 may be either a recess for forming, for example, a capacitor having a trench structure, or a recess for embedding a via hole therein. In the last case, the recess 22 serves as a through-hole in an interlayer dielectric between metal interconnects, with a via hole embedded therein. Further, in the last case, the recess 22 may be a metal interconnect groove formed integrally with a via hole by use of the dual damascene method.

Subsequently, the conductor film 30 is formed on sidewalls as well as the bottom of the recess 22, and on an upper surface of the insulating film 20. The conductor film 30 may be formed by either the chemical vapor deposition (CVD) method, or the atomic layer deposition (ALD) method. The conductor film 30 may be a metal film made of, for example, TiN, and so forth. In the case of the recess 22 being the recess for forming a capacitor therein, the conductor film 30 serves as a lower electrode of the capacitor, and in the case of the recess 22 being a recess for embedding a via hole therein, the conductor film 30 serves as a barrier metal film.

Thereafter, an unnecessary part of a portion of the conductor film 30, formed on the upper surface of the insulating film 20, is removed.

Figure 2:
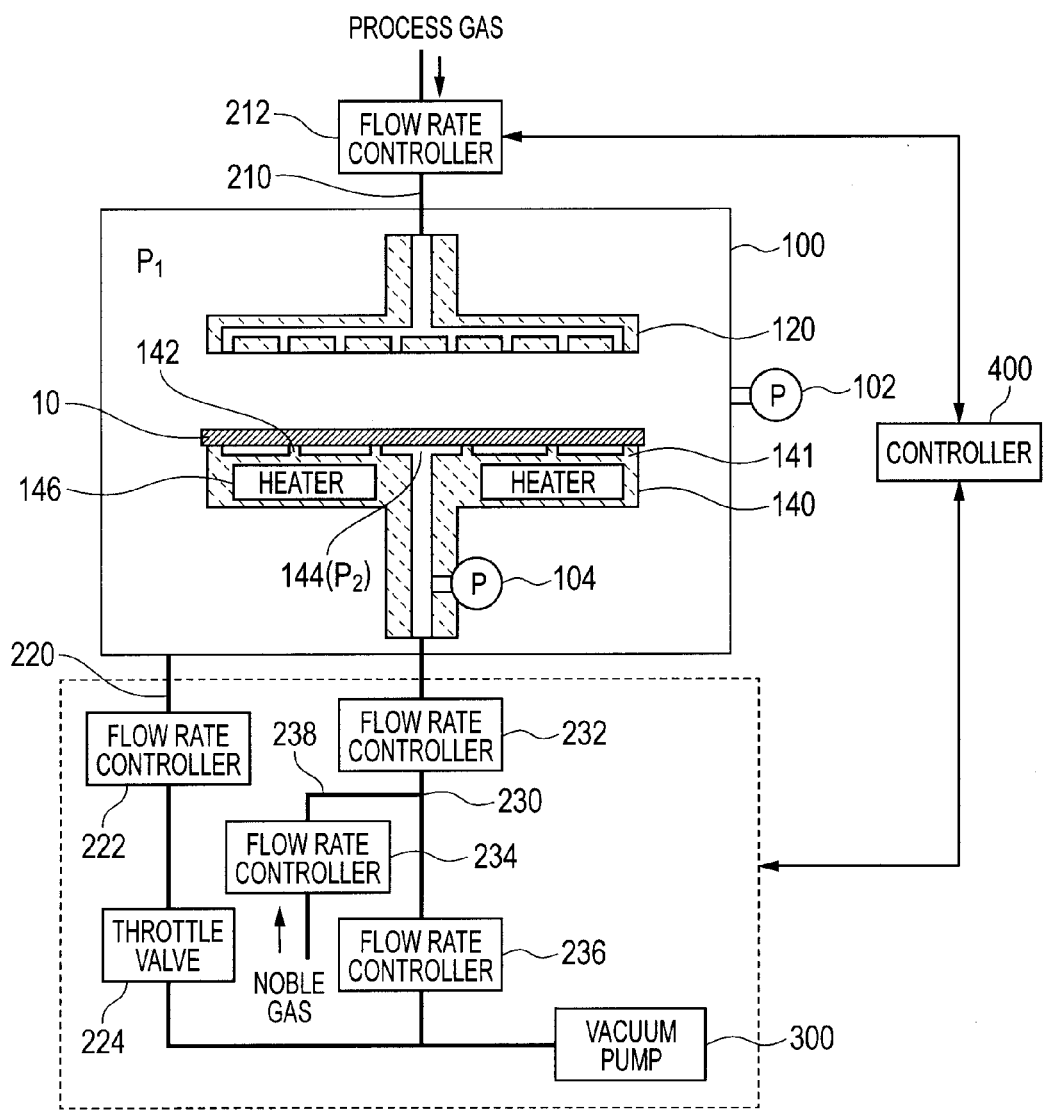
FIG. 2 is a view showing a configuration of a semiconductor manufacturing system for use in a manufacturing process shown in FIGS. 1A and 1B.

FIG. 2 is a view showing a configuration of the semiconductor manufacturing system for use in a manufacturing process shown in FIGS. 1A and 1B. The semiconductor manufacturing system has a vacuum chamber 100, and a stage 140. The stage 140 is disposed inside the vacuum chamber 100. A heating unit 146 including as a heater, and so forth is incorporated by the stage 140. An output of the heating unit 146 is controlled so as to keep temperature of the stage 140 at a given value. Such control may be executed by a controller 400 that is described later on.

The stage 140 has protrusions 141, 142, and an adsorption port 144. The semiconductor wafer 10 is placed over the protrusions 141, 142. The adsorption port 144 is provided in order to keep the semiconductor wafer 10 adsorbed to the stage 140, and is connected to a vacuum pump 300 via piping 230. The piping 230 is provided with flow rate controllers 232, 234, and an exhaust air volume from the adsorption port 144 is controlled by the flow rate controllers 232, 234, respectively. Further, piping 238 is connected to a part of the piping 230, between the flow rate controllers 232, 234, for connection with the vacuum pump 300 via a flow rate controller 236. The piping 238 guides an inert gas (for example, a rare gas) into the piping 230 via the flow rate controller 234.

A shower head 120 is also provided in the vacuum chamber 100. In the present specification, the shower head is a general term for a member in use for guiding a gas into the vacuum chamber 100, the member being provided with one gas inlet, or a plurality of gas inlets. The shower head 120 guides a process gas for processing the semiconductor wafer 10 into the vacuum chamber 100. The process gas is supplied to the shower head 120 via piping 210. The piping 210 is provided with a flow rate controller 212. A supply amount of the process gas is controlled by the flow rate controller 212.

Further, the vacuum chamber 100 is connected to the vacuum pump 300 via piping 220. The piping 220 is provided with a flow rate controller 222, and a throttle valve 224. An exhaust air volume from the vacuum chamber 100 is controlled by the flow rate controller 222, and the throttle valve 224.

The pressure $P_1$ inside the vacuum chamber 100 is measured by a pressure gauge 102, and the pressure $P_2$ inside the adsorption port 144 is measured by a pressure gauge 104. The flow rate controllers 212, 222, 232, 234, 236, and the throttle valve 224 are each controlled by the controller 400. Respective measured values of the pressure gauges 102, 104 are outputted to the controller 400. The controller 400 controls these measured values, respectively, thereby controlling the pressure $P_1$ inside the vacuum chamber 100, and the pressure $P_2$ inside the adsorption port 144 to desired values, respectively. The timing and values at which the controller 400 controls the pressure $P_1$ and the pressure $P_2$ will be described later.

Figure 3:
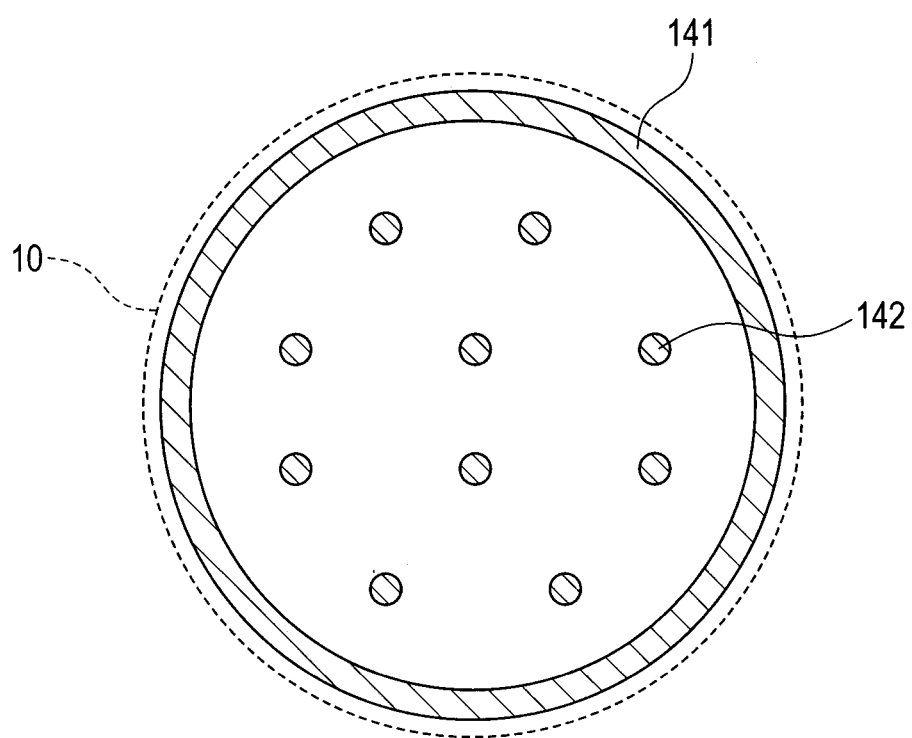
FIG. 3 is a plan view of a stage, showing a layout of protrusions by way of example.

FIG. 3 is a plan view of the stage 40, showing an example of a layout of the protrusions 141, 142. In the figure, the adsorption port 144 is omitted. The protrusion 141 is provided along the whole circumference of a rim of the stage 40. Further, a plurality of the protrusions 142 are provided across a region of the stage 40, on an inner side thereof, in such a way as to be apart from each other. The protrusions 142 are identical in height to the protrusion 141. In other words, an upper surface of the stage 40 is recessed except for the protrusions 141, 142, and a recessed region leads to the adsorption port 144.

Next, referring to a flow chart shown in FIG. 4, a method for forming the conductor film 30 by use of the semiconductor manufacturing system shown in FIG. 2 will be described. The stage 140 is preheated to a predetermined temperature. The predetermined temperature is not lower than 300° C., preferably not lower than 340° C. In the case of forming a TiN film for use as the conductor film 30, the stage 140 is kept at a predetermined temperature between not lower than 340° C., and not higher than 400° C.

With the stage 140 in an as-heated state, the semiconductor wafer 10 is placed over the stage 140 (step S10). The semiconductor wafer 10 is a silicon wafer, for example, 300 mm in diameter. However, the semiconductor wafer 10 may be either a silicon wafer 200 mm in diameter, or a silicon wafer 6 in. in diameter.

Then, the controller 400 sets the pressure $P_1$ inside the vacuum chamber 100 to a first pressure, setting the pressure $P_2$ inside the adsorption port 144 to a predetermined pressure. By so doing, a pressure difference $P_3$ between the pressure $P_1$ inside the vacuum chamber 100, and the pressure $P_2$ inside the adsorption port 144 is controlled to a set value (step S20). This set value is predetermined. Processing for determination of this set value is executed separately from processing shown in FIG. 4 and is described in detail later. The semiconductor wafer 10 is pressed against the stage 140 by the effect of the pressure difference $P_3$ between the pressure $P_1$ inside the vacuum chamber 100 and the pressure $P_2$ inside the adsorption port 144.

It is presumed that the smaller the pressure difference $P_3$ is at this point in time, the more unsusceptible the back surface of the semiconductor wafer 10 is to scarring. On the other hand, if the pressure difference $P_3$ is too small, this will raise a possibility that the semiconductor wafer 10 undergoes sliding over the protrusions 141, 142. With the present embodiment, the pressure difference $P_3$ is set to a minimum value at which the semiconductor wafer 10 is not allowed to slide over the protrusions 141, 142. The minimum value of the pressure difference $P_3$ is in a range of, for example, 3 to 5 Torr, that is, from 400 to 665 Pa. However, the pressure difference $P_3$ may be in excess of the minimum value, and not more than 1.5 times as large as the minimum value.

In this state, the semiconductor wafer 10 is left as it is for the duration of first time (step S30). By so doing, the semiconductor wafer 10 is heated up (an initial process).

As a result of studies conducted by the inventor, it has been found out that parts of the back surface of the semiconductor wafer 10 susceptible to scarring are in agreement with parts of the back surface in contact with the protrusions 141, 142, respectively. Further, according to the result of the studies conducted by the inventor, it has been found that if the pressure $P_1$ inside the vacuum chamber 100 in the initial process is high, flaws occur to the back surface of the semiconductor wafer 10, and as the pressure $P_1$ becomes lower, occurrence of flaws on the back surface of the semiconductor wafer 10 is inhibited, as described later on.

Figure 7:
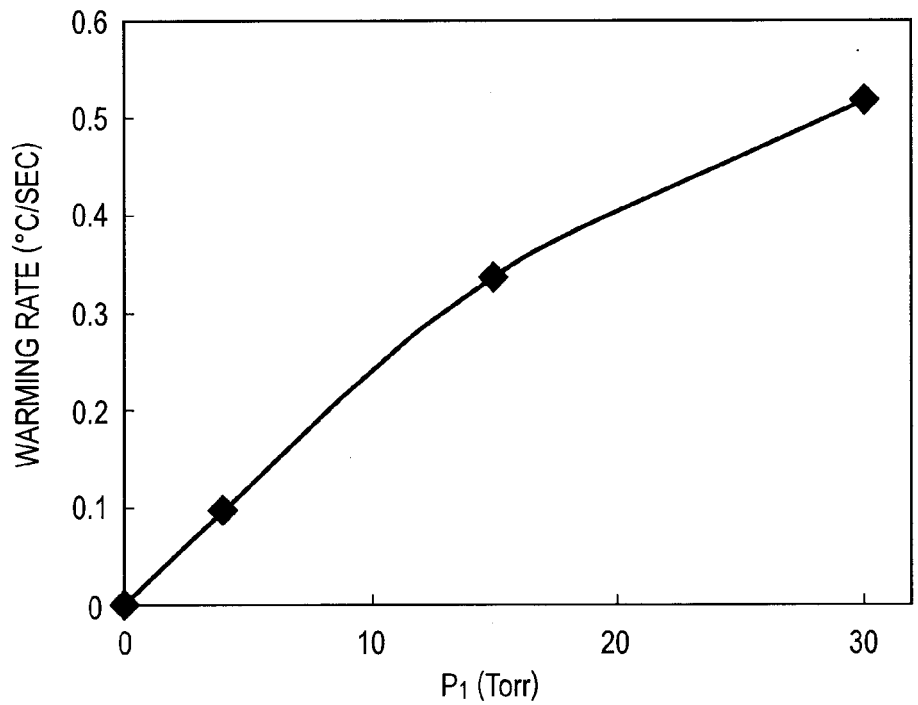
FIG. 7 is a graph showing a relationship between a warming rate of a semiconductor wafer and the pressure $P_1$ inside a vacuum chamber.

The reason for this remains uncertain, but it can be presumed as follows. According to the result of the studies conducted by the inventor, the higher the pressure $P_1$ is, the higher is a warming rate of the semiconductor wafer 10, as shown in FIG. 7. Accordingly, it can be presumed that the reason why the occurrence of flaws on the back surface of the semiconductor wafer 10 can be inhibited as the pressure $P_1$ is decreased is that the warming rate of the semiconductor wafer 10 becomes lower.

In particular, with the present embodiment, the stage 140 is preheated to the predetermined temperature. Accordingly, the parts of the back surface of the semiconductor wafer 10, in contact with the protrusions 141, 142, respectively, undergo localized thermal expansion more rapidly than other parts thereof immediately after the semiconductor wafer 10 is placed over the stage 140. It is therefore presumed that if the pressure $P_1$ is raised in the initial process, the back surface of the semiconductor wafer 10 will become particularly susceptible to occurrence of flaws.

Accordingly, with the present embodiment, a first pressure as the set value of the pressure $P_1$ is rendered lower to some extent. For example, the first pressure is set such that an average warming rate of the semiconductor wafer 10, until 5 seconds from placement of the semiconductor wafer 10 over the stage 140, is kept at 0.2° C./sec or lower.

Further, the first time is in a range of 1 to 15 sec. If the first time is too long, a time length for processing of the semiconductor wafer 10 will become too long because the warming rate of the semiconductor wafer 10 is kept low under conditions of the initial process. In this case, there occurs an increase in the manufacturing cost of a semiconductor device. Further, if the first time is too short, advantageous effects anticipated by setting the initial process cannot be obtained, so that it is presumed that the occurrence of flaws on the back surface of the semiconductor wafer 10 cannot be inhibited.

With the elapse of the first time, the controller 400 causes the pressure $P_1$ inside the vacuum chamber 100 to rise to a second pressure higher than the first pressure (step S40). By so doing, the warming rate of the semiconductor wafer 10 becomes higher (a heating process). In this state, second time is elapsed (step S50), and the semiconductor wafer 10 is heated up to a predetermined temperature. Thereafter, the process gas for film formation is guided from the shower head 120, thereby applying deposition processing to the semiconductor wafer 10 (step S60). Further, the process gas for heating processing is guided from the shower head 120 into the vacuum chamber 100 for a time period between the steps S20 to S50. The second pressure is in a range of, for example, 5 to 15 Torr, that is, from 665 to 2000 Pa. Further, the second pressure may be, for example, in excess of the first pressure, and not more than 3.75 times as large as the first pressure,.

In the heating process, the pressure $P_2$ inside the adsorption port 144, together with the pressure $P_1$ inside the vacuum chamber 100, is preferably increased. By so doing, it is possible to prevent the pressure difference $P_3$ between the pressures $P_1$, $P_2$ from rising more than necessary to thereby inhibit the semiconductor wafer 10 from being pressed against the protrusions 141, 142 by a stronger force than necessary. By so doing, the occurrence of flaws on the back surface of the semiconductor wafer 10 can be further inhibited.

The controller 400 controls the pressure difference $P_3$ in the heating process to a value in a range of, for example, 100 to 120% of the pressure difference $P_3$ in the initial process, preferably to a value equal to the pressure difference $P_3$ in the initial process.

Figure 4:
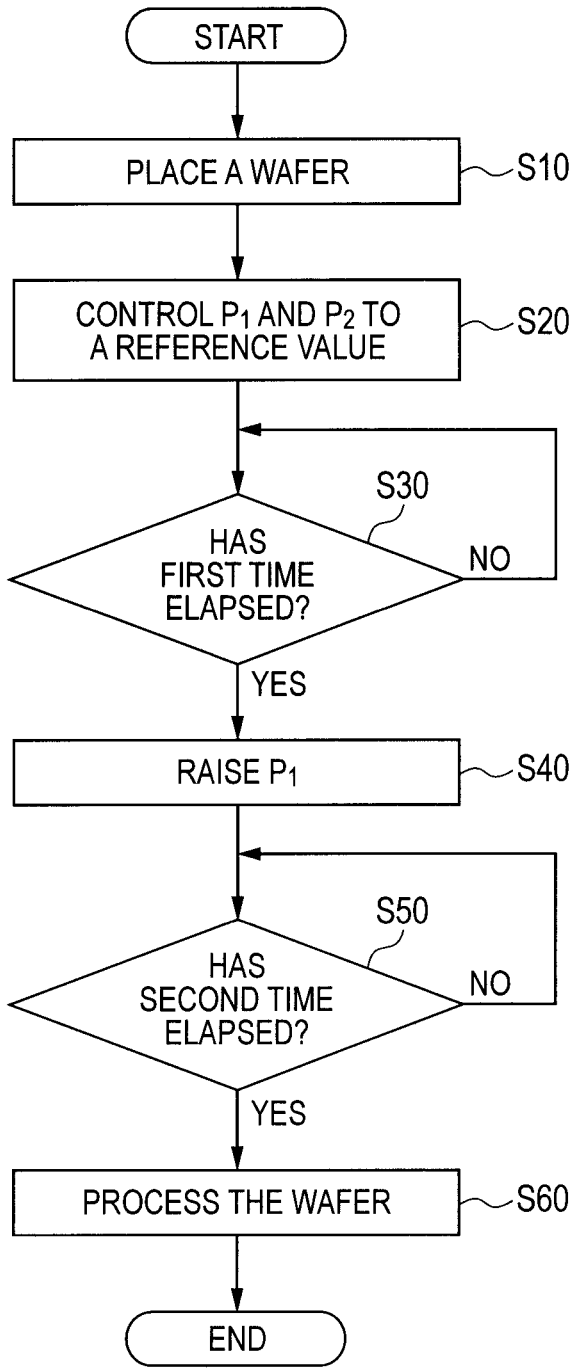
FIG. 4 is a flow chart for describing a method for forming a conductor film by use of the semiconductor manufacturing system shown in FIG. 2.
Figure 5:
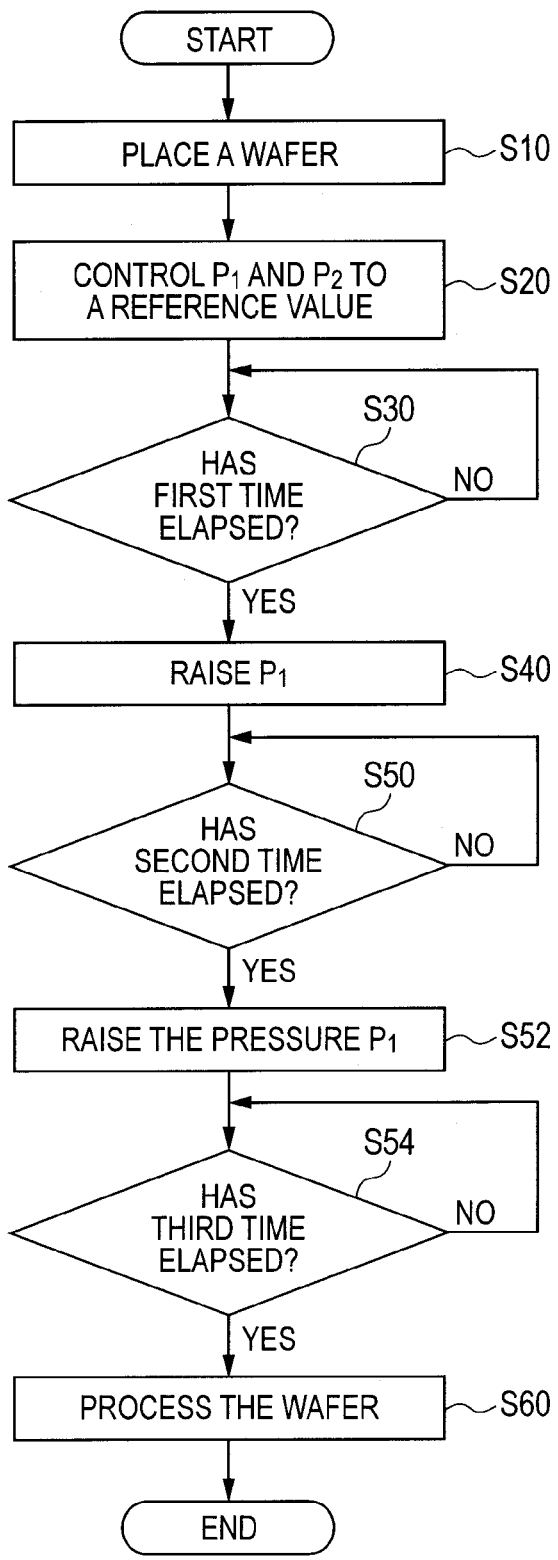
FIG. 5 is a flow chart showing a variation of the flow chart of FIG. 4.

FIG. 5 is a flow chart showing a variation of the flow chart of FIG. 4. With this embodiment, in addition to rendering second time in a step S50 to be shorter than the second time in FIG. 4, the pressure $P_1$ inside the vacuum chamber 100 is raised to a third pressure higher than the second pressure in FIG. 4 (step S52). By so doing, the warming rate of the semiconductor wafer 10 is further increased (a second heating process). In this state, third time is caused to elapse (step S54). By so doing, a time length necessary for heating the semiconductor wafer 10 up to a predetermined temperature can be rendered shorter.

After the semiconductor wafer 10 is heated up to the predetermined temperature, the process gas for the film formation is guided from the shower head 120, thereby applying the deposition processing to the semiconductor wafer 10 (step S60). Further, the process gas for the heating processing is guided from the shower head 120 into the vacuum chamber 100 during for a time period between the steps S20, S54.

Figure 6:
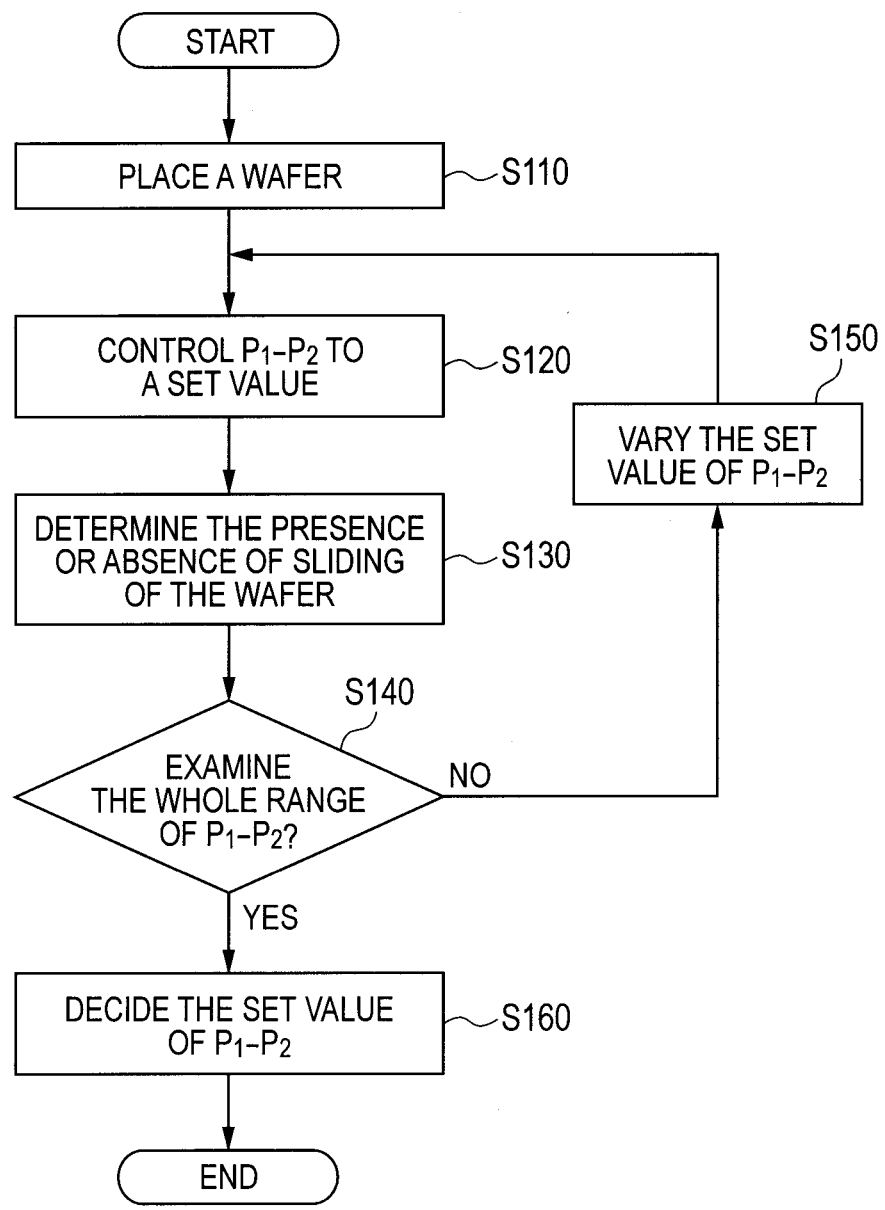
FIG. 6 is a flow chart showing processing for deciding a set value of a pressure difference $P_3$ between a pressure $P_1$ inside a vacuum chamber and a pressure $P_2$ inside an adsorption port, during step S20 shown in FIGS. 4, 5, respectively.

FIG. 6 is a flow chart showing processing for deciding the set value of the pressure difference $P_3$ between the pressure $P_1$ inside the vacuum chamber 100 and the pressure $P_2$ inside the adsorption port 144, during the step S20 shown in FIGS. 4, 5, respectively. The semiconductor wafer 10 is placed over the stage 140 (step S110). The controller 400 sets various conditions in the vacuum chamber 100 to conditions applied to the step S60. Then, processing shown in the following steps from step S120 to step 150 are executed.

First, the controller 400 sets the pressure difference $P_3$ to a value (the step S120). Subsequently, the controller 400 determines whether or not the semiconductor wafer 10 undergoes sliding over the protrusions 141, 142 after the semiconductor wafer 10 is left as it is for a while (the step S130). Processing in the step S130 is executed by use of, for example, a sensor for detection of sliding, the sensor being included the semiconductor device. Processing shown in the steps S120, S130, respectively, is executed until the whole range of the pressure difference $P_3$ as an examination target is examined (the step S140) while causing the pressure difference $P_3$ to be varied (the step S150).

Thereafter, a set value of the pressure difference $P_3$ is decided on the basis of data obtained in the step S130 (step S160). The pressure difference $P_3$ is set to, for example, the minimum value at which the semiconductor wafer 10 is not allowed to slide over the protrusions 141 and 142 as previously described. However, the pressure difference $P_3$ may be set to a value in excess of the minimum value, and not more than 1.5 times as large as the minimum value.

Further, the steps of processing shown in FIG. 4 or FIG. 5 are repeated a plurality of times while replacing the semiconductor wafer 10 with a new one after the steps of processing shown in FIG. 6 have been carried out for deciding the set value of the pressure difference $P_3$.

Figure 8:
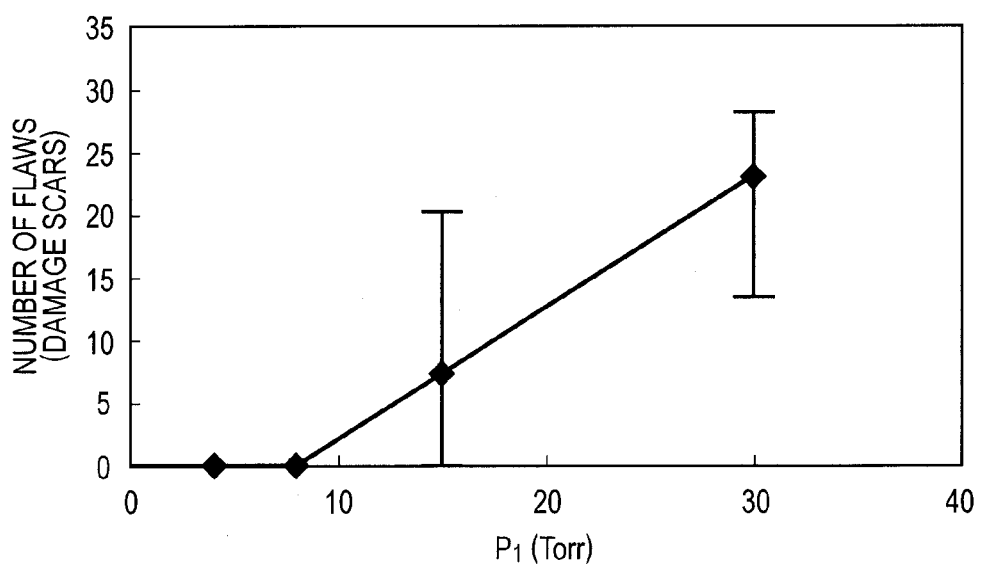
FIG. 8 is a graph showing a relationship between the pressure $P_1$ inside the vacuum chamber 100, and the number of flaws (damage scars) observed on a back surface of the semiconductor wafer.

FIG. 8 is a graph showing a relationship between the pressure $P_1$ inside the vacuum chamber 100, and the number of flaws (damage scars) observed on the back surface of the semiconductor wafer 10. As is evident from the graph, the number of the flaws is large if the pressure $P_1$ is at 30 Torr. Meanwhile, as the pressure $P_1$ approaches 15 Torr, the number of the flaws becomes much less as compared with the case where the pressure $P_1$ is at 30 Torr. Further, if the pressure $P_1$ is at 8 Torr, and 4 Torr, respectively, no flaws occur. In this case, the pressure $P_2$ inside the adsorption port 144 is kept at 1 Torr.

Figure 9:
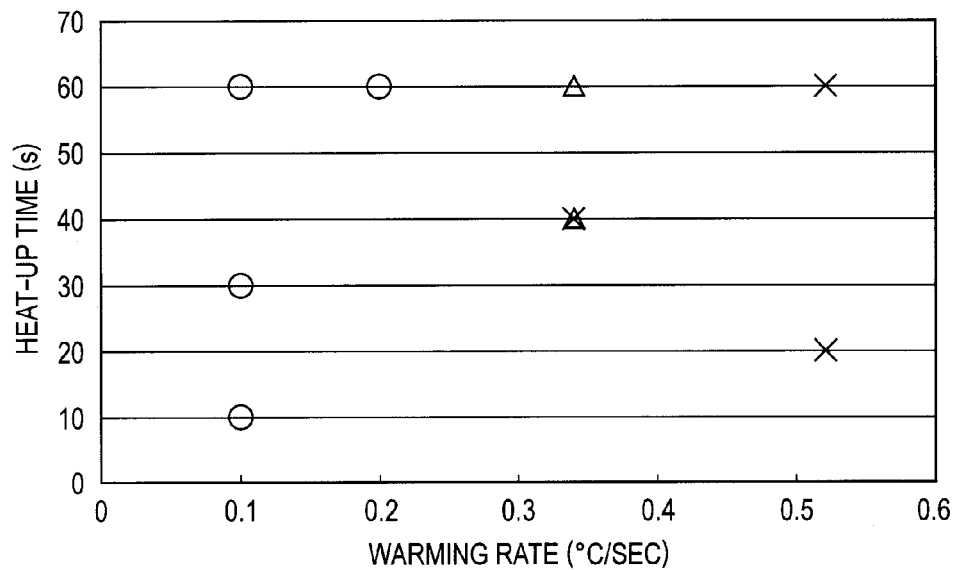
FIG. 9 is a view showing a relationship between an average warming rate of the semiconductor wafer until 5 seconds from placement of the semiconductor wafer over the protrusions of the stage, and an observation result such as whether or not flaws have occurred to the back surface of the semiconductor wafer.

FIG. 9 is a view showing a relationship between an average warming rate of the semiconductor wafer 10 until 5 seconds from placement of the semiconductor wafer 10 over the protrusions 141 and 142 of the stage 140 and whether or not flaws have occurred to the back surface of the semiconductor wafer 10. Further, the temperature of the stage 140 is set to the given value within the range described as above. The warming rate is changed by varying the pressure $P_1$ inside the vacuum chamber 100, as shown in FIG. 7.

As is evident from FIG. 9, it was found that if the pressure $P_1$ in the initial process is set such that the average warming rate of the semiconductor wafer 10, until 5 seconds from placement of the semiconductor wafer 10 over the stage 140, is at 0.2° C./sec or lower, flaws do not occur to the back surface of the semiconductor wafer 10, or even if the flaws occur thereto, the flaws occur to a negligible degree.

Figure 10:
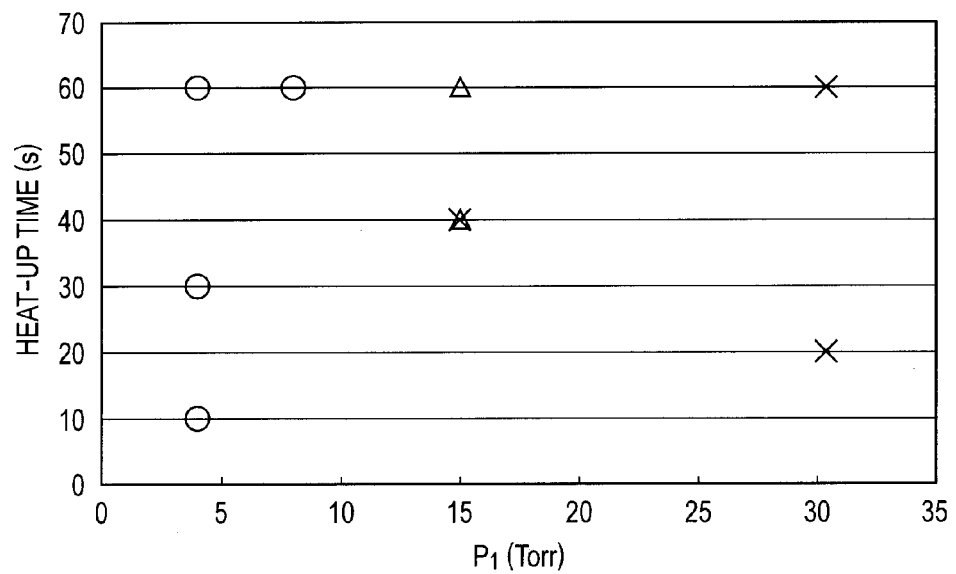
FIG. 10 is a view showing a relationship between the pressure $P_1$ inside the vacuum chamber in an initial process, and an observation result such as whether or not flaws have occurred to the back surface of the semiconductor wafer.

FIG. 10 is a view showing a relationship between the pressure $P_1$ inside the vacuum chamber 100, in the initial process, and an observation result such as whether or not flaws have occurred to the back surface of the semiconductor wafer 10. The pressure difference $P_3$ between the pressure $P_1$ inside the vacuum chamber 100, and the pressure $P_2$ inside the adsorption port 144 is found in a range of 3 to 5 Torr, regardless of heat-up time.

As is evident from the figure, if the pressure $P_1$ inside the vacuum chamber 100 is below 15 Torr, the occurrence of flaws on the back surface of the semiconductor wafer 10 can be inhibited. Further, as is evident from the figure, if the pressure $P_1$ inside the vacuum chamber 100 is below 8 Torr, either no flaw occurs to the back surface of the semiconductor wafer 10, or flaws occur thereto to a negligible degree.

In FIGS. 9, and 10, a sign "○(circle)" indicates the case where no flaw was confirmed on the back surface of the semiconductor wafer 10, a sign "Δ(triangle)" indicates the case where flaws are found occurring to the back surface of the semiconductor wafer 10 to only a negligible degree e, and a sign "x(cross)" indicates the case where flaws have occurred to the back surface of the semiconductor wafer 10 to a non-negligible degree.

Further, the observation result such as whether or not the flaws occur to the back surface of the semiconductor wafer 10 is not dependent on time for the initial process if the initial process is carried out for the duration of not less than 10 seconds.

As described in the foregoing, with the present embodiment, it is possible to inhibit a flaw from occurring to the back surface of the semiconductor wafer 10 at a time when the semiconductor wafer 10 is placed over the stage 140 to be heated up.

Second Embodiment

Figure 11A:
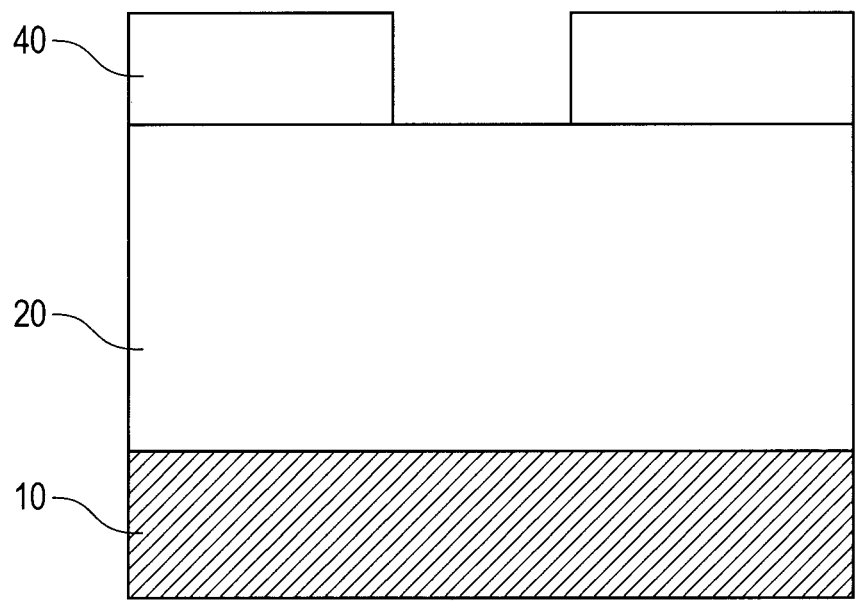
FIGS. 11A and 11B are sectional views showing a semiconductor device manufacturing method according to a second embodiment of the invention.
Figure 11B:
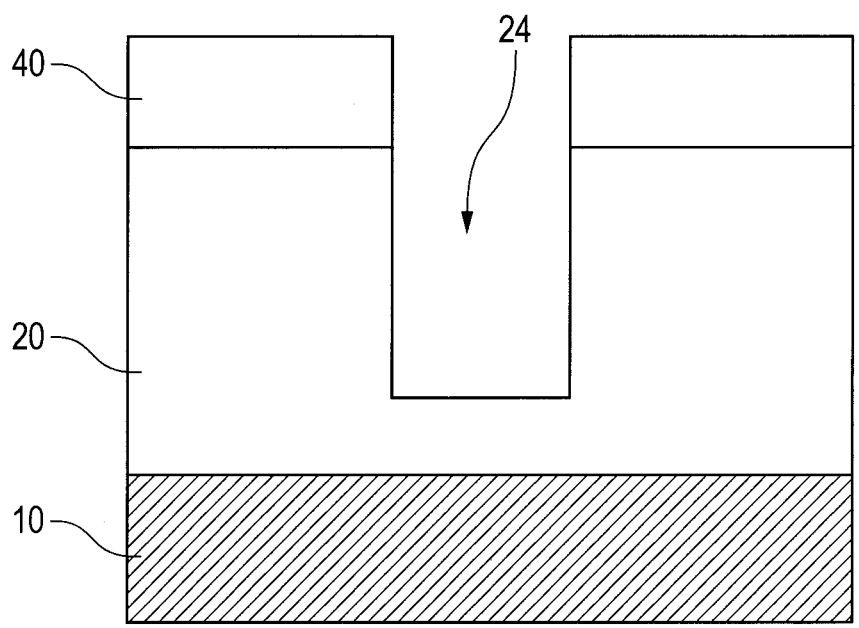

FIGS. 11A and 11B are a sectional view showing a semiconductor device manufacturing method according to a second embodiment of the invention. The semiconductor device manufacturing method includes a step of processing for forming a recess 24 in an insulating film 20.

First, the insulating film 20 is formed over a semiconductor wafer 10, as shown in FIGS. 11A. Subsequently, a mask pattern 40 (for example, a resist pattern) is formed on the insulating film 20.

Subsequently, as shown in FIGS. 11B, dry etching is applied to the insulating film 20 by use of the mask pattern 40 as a mask. By so doing, the recess 24 is formed. The recess 24 is a trench for embedding, for example, an interconnect groove, a via hole, a contact hole, or a capacitor element therein.

A semiconductor device used in the step of processing shown in FIGS. 11A and 11B is identical in configuration to the semiconductor device shown in FIG. 2. However, a shower head 120, and a stage 140 each function as an electrode for use in generation of plasma, as well. The semiconductor wafer 10 is placed over the stage 140 to be heated up to a predetermined temperature by use of the same method as used in the case of the first embodiment.

With the present embodiment as well, it is possible to inhibit a flaw from occurring to the back surface of the semiconductor wafer 10 at a time when the semiconductor wafer 10 is placed over the stage 140 to be heated up.

(The first embodiment)

In the step S20 shown in FIG. 4, the pressure $P_1$ inside the vacuum chamber 100 was set to 4 Torr, and the pressure $P_2$ inside the adsorption port 144 was set to 1 Torr. In the step S30, the first time was set to 10 seconds. After a rise in the pressure $P_1$ inside the vacuum chamber 100 in the step S40, the pressure $P_1$ was set to 10 Torr, and the pressure $P_2$ inside the adsorption port 144 was set to 7 Torr. In the step S50, the second time was set to 30 seconds. A flow rate of the process gas that was caused to flow from the shower head 120 into the vacuum chamber 100 was 7000 sccm for the time period between the steps S20 to S50.

Even after the processing in the step S60 of FIG. 4 is applied under conditions described as above, cracking did not occur to the semiconductor wafer 10.

(The second embodiment)

In the step S20 shown in FIG. 5, the pressure $P_1$ inside the vacuum chamber 100 was set to 4 Torr, and the pressure $P_2$ inside the adsorption port 144 was set to 1 Torr. In the step S30, the first time was set to 10 seconds. After a rise in the pressure $P_1$ inside the vacuum chamber 100 in the step S40, the pressure $P_1$ was set to 10 Torr, and the pressure $P_2$ inside the adsorption port 144 was set to 7 Torr. In the step S50, the second time was set to 10 seconds. Further, in the step S52, after a rise in the pressure $P_1$ inside the vacuum chamber 100, the pressure $P_1$ was set to 30 Torr, and the pressure $P_2$ inside the adsorption port 144 was set to 10 Torr. In the step S54, the third time was set to 8 seconds. Further, a flow rate of the process gas that was caused to flow from the shower head 120 into the vacuum chamber 100 was 7000 sccm for the time period between the steps S20 to S54.

Even after the processing in the step S60 of FIG. 5 is applied under conditions described as above, cracking did not occur to the semiconductor wafer 10.

Having described the embodiments of the invention, and the examples thereof with reference to the accompanying drawings, as above, it is to be pointed out that such description is for illustrative purposes only, and it is to be understood that various configurations other than those described in the foregoing may be adopted without departing from the spirit or scope of the following claims.

What is claimed is:

1. A semiconductor device manufacturing method for manufacturing a semiconductor device, the method comprising the following steps:
   (a) providing a semiconductor manufacturing system having a vacuum chamber, and a stage disposed inside the vacuum chamber, the stage being provided with protrusions formed on an upper surface thereof, an adsorption port for adsorbing a wafer thereto, and a heating unit:

(b) conducting a process including placing the wafer over the stage, the stage being kept in an as-heated state, setting a pressure inside the vacuum chamber to a first pressure, and subsequently holding the first pressure for the duration of a first time; and (c) conducting a heating process including raising the pressure inside the vacuum chamber to a second pressure higher than the first pressure with the stage kept in the as-heated state after the step (b) to thereby heat up the wafer, wherein the first pressure in the step (b) is set such that an average warming rate of the wafer until 5 seconds from placement of the wafer over the stace is kept at 0.2° C./sec or lower.

2. The semiconductor device manufacturing method according to claim 1, wherein, in the step (b), a pressure difference between the pressure inside the vacuum chamber and a pressure inside the adsorption port is set to a value corresponding to a minimum value at which the semiconductor wafer is not allowed to slide over the protrusions.

3. The semiconductor device manufacturing method according to claim 1, wherein whether or not the semiconductor wafer undergoes sliding over the protrusions is pre-examined by using a procedure including varying a pressure difference between the pressure inside the vacuum chamber and a pressure inside the adsorption port, and a set value of the pressure difference is decided based on an examination result.

4. The semiconductor device manufacturing method according to claim 1, wherein, in the step (b), a pressure difference between the pressure inside the vacuum chamber and a pressure inside the adsorption port is controlled to a range of 400 to 665 Pa.

5. The semiconductor device manufacturing method according to claim 1, wherein, in the step (c), a pressure difference between the pressure inside the vacuum chamber and a pressure inside the adsorption port is controlled to a value in a range of 100 to 120% of that for the pressure difference in the step (b).

6. The semiconductor device manufacturing method according to claim 5, wherein the pressure difference in the step (c) is controlled to a value equal to that for the pressure difference in the step (b).

7. The semiconductor device manufacturing method according to claim 1, wherein the stage in the step (b) is at temperatures not lower than 300° C.

8. The semiconductor device manufacturing method according to claim 1, wherein the first time is in a range of 2 to 15 sec.

9. The semiconductor device manufacturing method according to claim 1, wherein deposition processing is applied to the wafer after the step (c).

10. The semiconductor device manufacturing method according to claim 1, wherein dry etching processing is applied to the wafer after the step (c).

* * * * *